(12) United States Patent
Song

(10) Patent No.: US 6,867,055 B2
(45) Date of Patent: Mar. 15, 2005

(54) METHOD OF TESTING ION IMPLANTATION ENERGY IN ION IMPLANTATION EQUIPMENT

(75) Inventor: Doo Guen Song, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/776,594

(22) Filed: Feb. 12, 2004

(65) Prior Publication Data

US 2004/0185587 A1 Sep. 23, 2004

(30) Foreign Application Priority Data

Mar. 18, 2003 (KR) .................................. 10-2003-0016757

(51) Int. Cl.[7] .............................................. H01L 21/66
(52) U.S. Cl. ............................ 438/14; 438/17; 438/527; 257/E21.521
(58) Field of Search ............................ 438/14, 17, 527; 257/E21.521, E21.525, E21.529, E21.531

(56) References Cited

U.S. PATENT DOCUMENTS

| | | | |
|---|---|---|---|
| 6,033,922 A | * | 3/2000 | Rowland et al. ............... 438/14 |
| 6,055,460 A | | 4/2000 | Shopbell |
| 6,107,108 A | * | 8/2000 | Chen et al. .................... 438/14 |
| 6,366,873 B1 | | 4/2002 | Beardmore et al. |
| 6,472,232 B1 | * | 10/2002 | Johnson et al. ............... 438/14 |
| 2002/0079465 A1 | | 6/2002 | Halling |
| 2003/0045077 A1 | * | 3/2003 | Yoshihisa .................... 438/530 |

* cited by examiner

Primary Examiner—Trung Dang
(74) Attorney, Agent, or Firm—Volentine Francos & Whitt P.L.L.C.

(57) ABSTRACT

A method of testing ion implantation equipment verifies the level of ion implantation energy. The method includes implanting first conductive ions in an implantation region in a semiconductor substrate, implanting second conductive ions, having valence different from that of the first conductive ions, in the implantation region so as to produce a second well, and subsequently measuring a sheet resistance of the semiconductor substrate. The implanting of the second conductive ions may be carried out while varying the level of the ion implantation energy. By forming a twin well in this way, and then measuring the sheet resistance, the value of the sheet resistance can be precisely correlated to the amount of energy used to form a well.

8 Claims, 3 Drawing Sheets

METHOD OF TESTING ION IMPLANTATION ENERGY IN ION IMPLANTATION EQUIPMENT

BACKGROUND OF THE INVENTION

1. Field of the Invention

The present invention relates to ion implantation. More particularly, the present invention relates to a method of testing the level of ion implantation energy provided by ion implantation equipment.

2. Description of the Related Art

Part of the architecture of a prior art semiconductor device includes a twin well scheme as shown in FIG. 1. This typical twin well scheme has a core well having a p-type conductivity (Pwell CORE), and a peripheral well having a p-type conductivity (Pwell PERI) in a p-type substrate (P-sub). The twin well scheme is convenient to manufacture because both wells can be produced in a single process. However, independent biasing is impossible because the Pwells are formed directly in the p-type substrate (P-sub).

In order to overcome the shortcomings of this well scheme, most present devices employ a triple well scheme, as shown in FIG. 2. Independent biasing can be performed for each p-well under the triple well scheme. Also, the scheme provides a basis for enhancing the operating characteristics of transistors of a dynamic random access memory (DRAM) formed on the P-sub, for example.

More specifically, a DRAM cell region (memory cell region) is formed on the pocket p-well (Pwell CORE) surrounded by the deep n-well (Deep-Nwell). On the other hand, a peripheral (circuit) region of the DRAM is formed on a portion of the p-type substrate (P-sub) to the side of the deep n-well. The p-wells, as acceptors at the cell region and peripheral circuit region, can be discriminated from each other due to the provision of the n-well serving as a donor. Thus, these p-wells can undergo independent biasing.

Therefore, in this scheme, noise from the peripheral region is prevented from influencing the memory cell region, and the memory cell region can be controlled independently of the peripheral region. Accordingly, a short-channel effect of the peripheral region can be easily controlled. Also, the scheme facilitates the manufacturing of a relatively small substrate voltage generating circuit.

Now, when the DRAM is manufactured using this p-type substrate, n-channel MOS transistors are produced on the memory cell region, and n-channel and p-channel MOS transistors are produced on the peripheral region. In order to form an n-channel MOS transistor of the memory cell region, and n-channel and p-channel MOS transistors of the peripheral region in separate wells, the p-well of the memory cell region must be isolated from the p-type silicon substrate. It is therefore essential to employ the above-described triple well scheme in which the n-well is deeper than and encompasses the p-well (pocket well) in the memory cell region. Such technology is disclosed in U.S. Pat. No. 5,397,734 entitled "Method of Fabricating a Semiconductor Memory Device Having a Triple Well Structure".

Designing an optimum triple well thus involves establishing a control for the depth of the n-well and the pocket p-well. To this end, the wells are formed by implanting ions into the substrate to the desired depth. Accordingly, controlling the very high level of the ion implantation energy used to form the deep n-well is a very important process in achieving the desired characteristic of the resultant semiconductor device. It is thus essential to check and clarify whether each piece of ion implantation equipment in a mass production line is emitting the desired (normal) level of ion implantation energy. It is also necessary to confirm whether all of the pieces of ion implantation equipment are outputting the same level of ion implantation energy.

Although ion implantation equipment is provided with a control apparatus capable of controlling the ion implantation energy, it is very difficult to check and clarify whether the actual level of the ion implantation energy is within normal parameters because the ion implantation energy is generally in a high voltage state on the order of hundreds or thousands of keV. In an attempt to confirm the level of ion implantation energy, the prior art ion implantation equipment for forming wells on a silicon substrate employs a process monitor comprising a secondary ion mass spectrometer (SIMS) or a sheet resistance (RS) measuring device to obtain a projected range of the energy of ions implanted into a silicon wafer.

The graph of FIG. 3 illustrates the results of an RS measurement in which the level of ion implantation energy was changed within a range of about 5% using conventional ion implantation equipment to produce three different wells in a silicon substrate. Referring to FIG. 3, it is evident that a definite projected value of ion implantation energy put out by the ion implantation equipment is difficult to obtain from a monitoring procedure using RS measurement.

SUMMARY OF THE INVENTION

Accordingly, an object of the present invention is to provide a method of testing ion implantation equipment that will accurately verify the level of ion implantation energy used in conducting an ion implantation process.

According to one aspect of the present invention, a twin well (or well scheme comprising at least two wells) is formed in a semiconductor substrate as a specimen. The at least two wells are formed by implanting first and second conductive each having different valences into the substrate to different depths. The wells thus overlap beginning at a boundary within said substrate, i.e., the first and second conductive ions are both present in a region at the boundary between the wells.

Subsequently, a sheet resistance (RS) of the semiconductor substrate is measured. The sheet resistance thus measured is representative of the change in resistance that occurs at the boundary where the wells begin to overlap.

According to another aspect of the present invention, a method of testing a level of ion implantation energy in an ion implantation equipment includes performing a first ion implantation process in which first conductive ions are implanted to a first depth to form a first well in a semiconductor substrate, performing a second ion implantation process in which second conductive ions, having a valence different from that of the first conductive ions, are implanted into the same region of the semiconductor substrate as the first conductive ions but while varying the level of ion implantation energy, and subsequently measuring the sheet resistance of the semiconductor substrate.

In this case, the method can be applied to several substrates using different ion implantation apparatuses of a mass production line. The level of ion implantation energy of one or all of the apparatuses can be varied.

According to the present invention, the value of the sheet resistance at the boundary where the wells overlap is used to obtain a precise indication of the doping depth and thus, the level of the ion implantation energy. Furthermore, by carrying out the process on several substrate specimens using a plurality of ion implantation apparatuses, the sheet resistance values can be used to compare the levels of energy output by the ion implantation apparatuses. The data can be updated so that the apparatuses can be calibrated to all provide the same level of ion implantation energy.

BRIEF DESCRIPTION OF THE DRAWINGS

The present invention will become more fully understood from the detailed description of the preferred embodiments thereof made with reference to the accompanying drawings, wherein.

DETAILED DESCRIPTION OF THE PREFERRED EMBODIMENTS

The preferred embodiments of the present invention will be described hereinafter.

According to one embodiment of the present invention, a method of testing the level of ion implantation energy in ion implantation equipment includes forming at least a double well (a well within a well) in a semiconductor substrate, and subsequently measuring the sheet resistance (Rs) of the semiconductor substrate. The forming of the wells is carried out by doping a substrate with first and second conductive ions of different valences to different depths, as represented by curves $I_a$ and $I_1$ in FIG. 5, for example (described in more detail below). Thus, the level of ion implantation energy is tested based on the overlapping regions in which the first and second conductive ions are implanted to different depths (I).

According to another embodiment of the present invention, a method of testing the level of ion implantation energy in ion implantation equipment includes performing a first ion implantation process in which first conductive ions are implanted to a first depth to form a first well in an implantation region of at least one semiconductor substrate, performing a second ion implantation process in which second conductive ions having a valence different from that of the first conductive ions are implanted into the implantation region so as to produce a second well, wherein the level of the ion implantation energy is varied throughout the course of the second ion implantation process such that the first and second wells have overlapping regions, and subsequently measuring the RS value of each semiconductor substrate.

Figure 1:
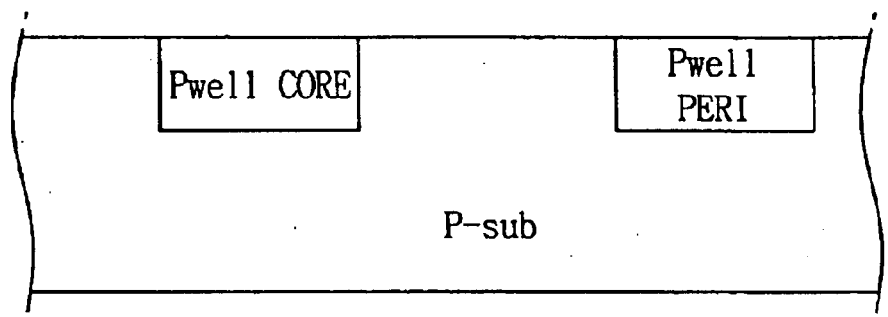
FIG. 1 is a sectional view of a semiconductor substrate having a conventional twin well scheme.
Figure 2:
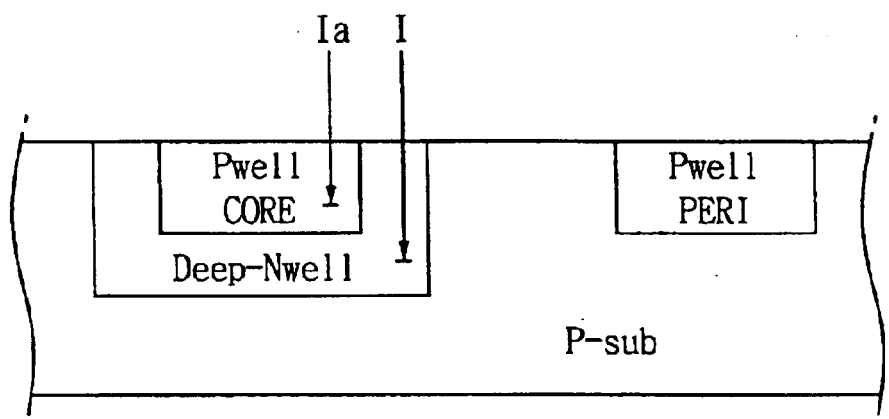
FIG. 2 is a sectional view of a semiconductor substrate having a conventional triple well scheme.
Figure 3:
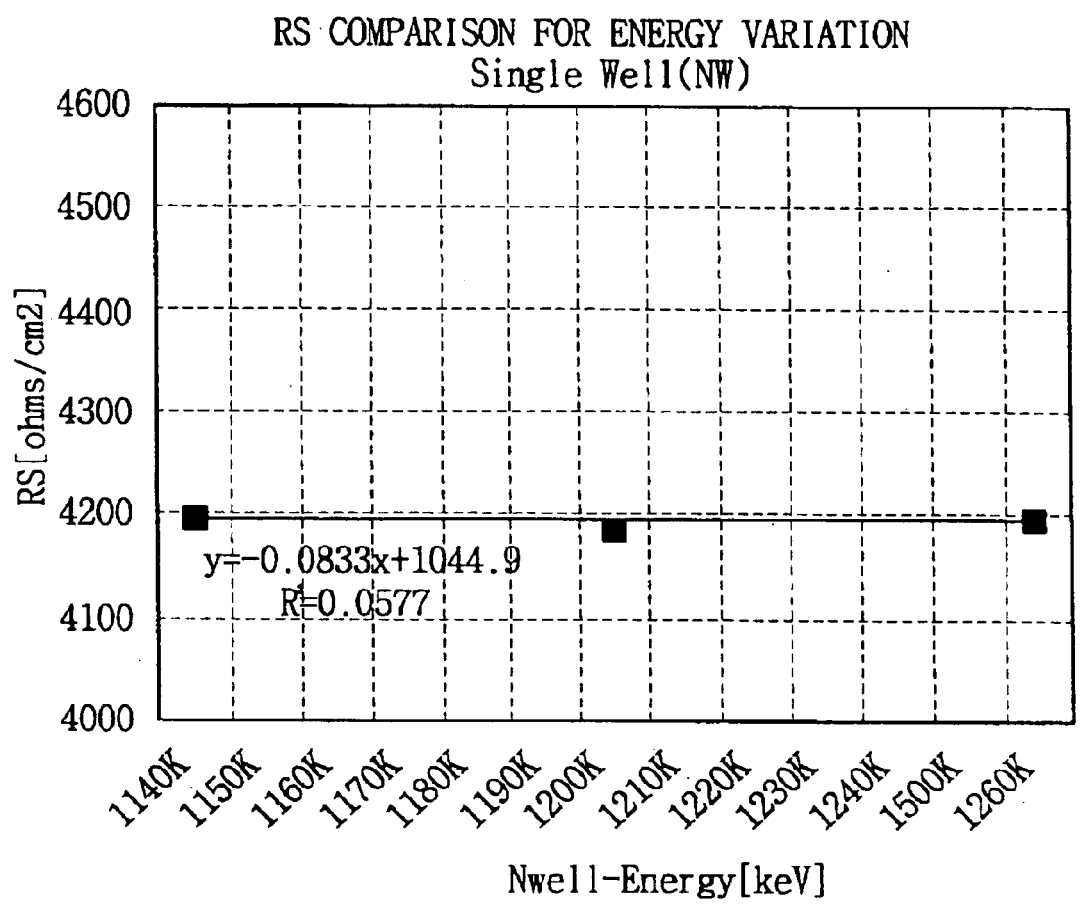
FIG. 3 is a graph showing sheet resistances measured from three wells formed on a semiconductor substrate by varying the ion implantation energy level of ion implantation equipment in the prior art.
Figure 4:
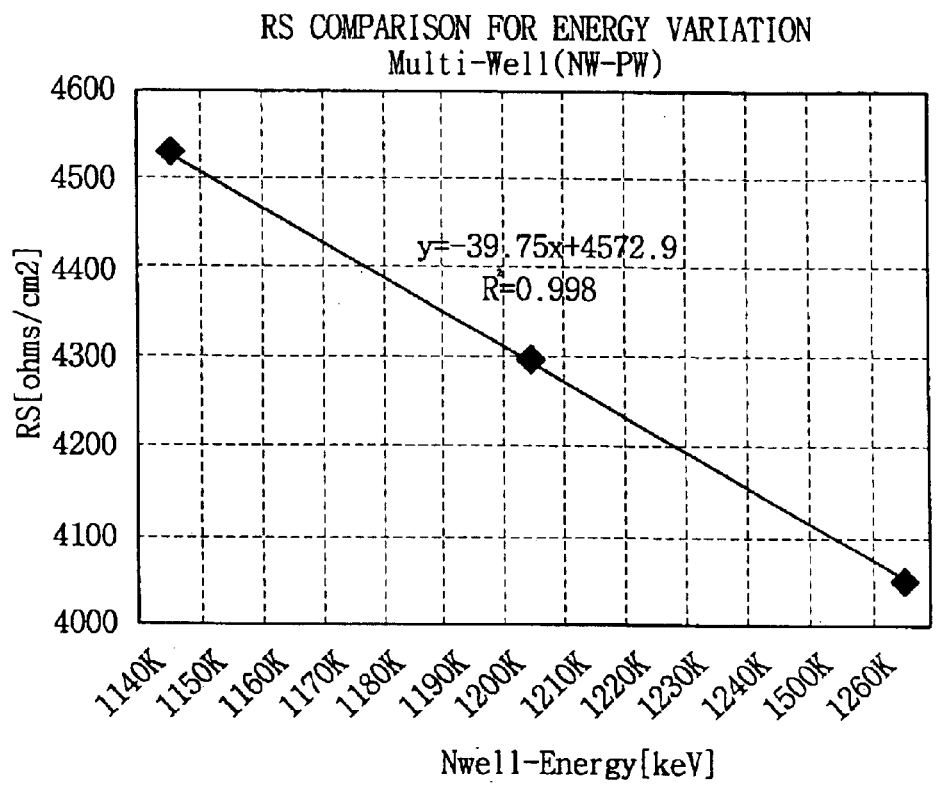
FIG. 4 is a graph showing the sheet resistance of semiconductor substrates in which double wells were formed by varying the ion implantation energy level of an ion implantation apparatus.

In each of the embodiments, the RS value(s) is/are based, in part, on the resistance offered by the overlapping portions of the first and second wells. That is, the RS value is derived on the basis of that portion of the substrate where the first and second conductive impurities overlap at the boundary between the first and second wells. An RS value obtained in this way provides an excellent indicator of the energy used to form the deeper of the wells, e.g., a deep n-well, as shown in FIG. 4.

Furthermore, according to the present invention, the first well is preferably formed by implanting the first conductive ions to a depth lower than that to which the second conductive ions are implanted. That is, the second (subsequently formed) well is formed at an upper part of the implantation region within the first well. For example, the first well is formed to a depth $I_1$ in FIG. 5, whereas the second well is formed to a depth $I_2$.

Alternatively, though, the first well can be formed by doping an upper part of the semiconductor substrate with the first conductive ions, and the second well can be formed by subsequently implanting the second conductive ions into the same region but to a depth greater than that to which the first conductive ions were implanted. For example, the first well is formed to a depth $I_1$ in FIG. 5, whereas the second well is formed to a depth $I_3$.

In addition, according to another aspect of the invention, a first well can be formed on each of a plurality of semiconductor substrates using different ion implantation apparatuses each set to the same level so as to output the same ion implantation energy. Second wells are each formed while varying the ion implantation energy output by any one of ion implantation apparatuses. According to still another aspect of the invention, the second wells can instead each be formed while varying the ion implantation energy output by each of the different ion implantation apparatuses.

Using either of these procedures, the levels of the ion implantation energies output by the respective ion implantation apparatuses are compared with one another on the basis of the RS values measured from the plurality of semiconductor substrates. Accordingly, the ion implantation energies output by the respective ion implantation apparatuses can be updated. As a result, the plurality of ion implantation apparatuses can be calibrated to output the same level of ion implantation energy, i.e., levels within the same range.

In the meantime, the level of the ion implantation energy output by any one ion implantation apparatus can be similarly confirmed using the principles described above. To this end, either the first or the second well is formed on the plurality of semiconductor substrates by changing, within a predetermined range, the level of ion implantation energy output by the ion implantation apparatus.

Subsequently, the RS values of the semiconductor substrates are compared with each other to thus verify the levels of ion implantation energy output by the ion implantation apparatus. That is, the method of testing the level of ion implantation energy can include a step of obtaining values for each level of ion implantation energy output by the apparatus. In this procedure, the level of ion implantation energy can be varied by an amount within a range of 0.5~8% of the initial ion implantation energy.

As should be clear from the descriptions of the various procedures detailed above, the semiconductor substrate can be doped with a p-type impurity, in which case the lower well (either of the first and second wells referred to above) is of an n-type impurity, and the upper well (the other of the first and second wells) is of a p-type impurity.

Alternatively, the semiconductor substrate can be doped with an n-type impurity. In this case, the lower well is of a p-type impurity, and the upper (pocket) well is of an n-type impurity.

That is, at least two wells (first and second wells) are formed on a semiconductor substrate, as a specimen, within the same region by carrying out ion implantation processes to different depths, wherein the wells have overlapping regions where the impurities are commingled. Then the RS value is measured, yielding a value based on the resistance at the boundary between the two wells, namely at the region where the first and second wells overlap. In this case, the RS value can be used to accurately indicate the ion implantation energy level of the ion implantation equipment.

FIG. 4 illustrates results obtained through the procedures mentioned above, which results confirm the principles of the present invention. To derive this graph, an ion implantation apparatus was used to form three twin wells (referred to as a "multi-well" at the top of the figure) using different levels of ion implantation energy, respectively. The RS values each are different, and the differences between the RS values correspond to the changes in the level of the ion implantation energy used in forming the twin wells.

Figure 5:
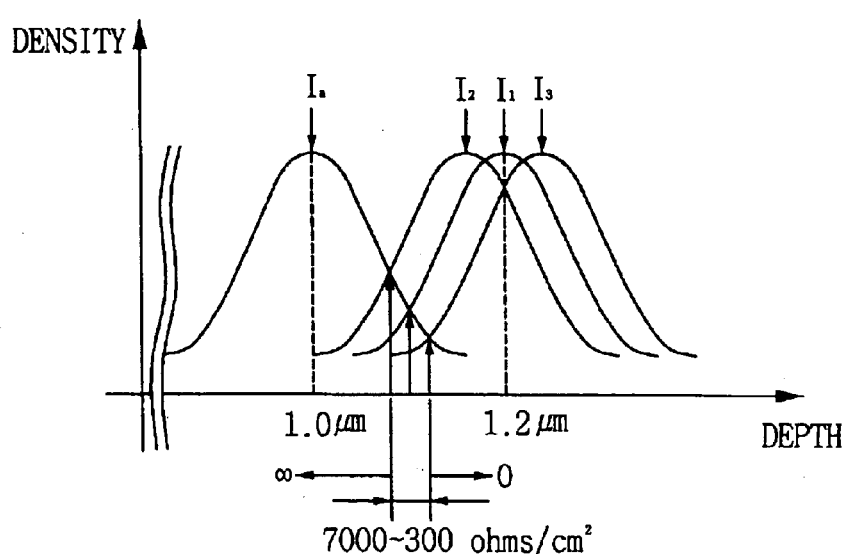
FIG. 5 is a graph illustrating a relationship between the density of the conductive material, sheet resistance, and depth of ion implantation when forming multiple wells within a substrate.

FIG. 5 illustrates the various embodiments described above, including those in which one well is formed on each of a plurality of semiconductor substrate specimens using the same level of ion implantation energy aimed at implanting the first conductive ions to a depth $I_a$, for example, and the other well is formed using a different ion implantation energy (constant or varying) aimed implant the second conductive ions to a different depth (within the range of $I_1$–$I_3$, for example). As the figure shows, these first and second ion implantation processes produce an overlapping region of the first and second conductive ions, where the resistance values change markedly.

As was described above, a level of ion implantation energy output by an ion implantation apparatus is tested by using a resistance value at the boundary between at least two wells which are doped with impurities having different valences, whereby the implantation depth and level of the ion implantation energy used to form a well can be precisely confirmed. In addition, the levels of ion implantation energy from a plurality of ion implantation apparatuses can be verified so as to prevent process defects form occurring and hence, enhance the manufacturing yield.

Finally, modifications and variations of the above-described preferred embodiments of the present invention will be readily apparent to those skilled in the art that. Accordingly, these and other changes and modifications are seen to be within the true spirit and scope of the invention as defined by the appended claims.

What is claimed is:

1. A method of testing a level of ion implantation energy in ion implantation equipment, comprising:

implanting first conductive ions to a first depth in a semiconductor substrate to form a first well of the first and conductive ions in the semiconductor substrate;

implanting second conductive ions to a second depth, different from said first depth, in said semiconductor substrate to form a second well of the second conductive ions in the semiconductor substrate, the second conductive ions having a valence different from that of the first conductive ions, and the implanting of said first and second conductive ions being carried out at the same region of the substrate such that the first and second wells constitute a well within a well wherein the wells overlap beginning at a boundary within said substrate;

subsequently measuring the sheet resistance of the semiconductor substrate; and correlating the value of the sheet resistance to the level of ion implantation energy used in said forming of the wells.

2. A method of testing a level of ion implantation energy in ion implantation equipment, comprising:

performing a first ion implantation process in which first conductive ions are implanted to a first depth in at least one semiconductor substrate to form a first well in each at least one semiconductor substrate;

performing a second ion implantation process in which second conductive ions are implanted into said semiconductor substrate to form a second well in each at least one semiconductor substrate, the second conductive ions having a valence different from that of the first conductive ions, the implanting of said second conductive ions being carried out at the same region of the substrate as said first conductive ions, such that the first and second wells constitute a well within a well wherein the wells overlap beginning at a boundary within said substrate, and for at least one said substrate so specified, said second ion implantation process being carried out while varying the ion implantation energy such that a boundary region within the substrate where the first and second wells overlap contains a plurality of depth-wise locations where the resistance varies;

subsequently measuring the sheet resistance of said at least one semiconductor substrate to yield at least one sheet resistance value; and correlating the at least one sheet resistance value to a level of ion implantation energy used in said forming of the wells.

3. The method as claimed in 2, wherein said first ion implantation process comprises forming a said first well on each of a plurality of semiconductor substrates using different ion implantation apparatuses, respectively, set to the same level of ion implantation energy, and said second ion implantation process comprises forming a said second well on each of the semiconductor substrates using one of the implantation apparatuses, while varying the ion implantation energy output by the one of the ion implantation apparatuses.

4. The method as claimed in 2, wherein said first ion implantation process comprises forming a said first well on each of a plurality of semiconductor substrates using different ion implantation apparatuses, respectively, set to the same level of ion implantation energy, and said second ion implantation process comprises forming a said second well on each of the semiconductor substrates using the corresponding ion implantation apparatuses, respectively, while varying the ion implantation energy output by each of the ion implantation apparatuses.

5. The method as claimed in 3, and further comprising comparing ion implantation energy levels of the respective ion implantation apparatuses derived from the sheet resistance values measured for each of the semiconductor substrates.

6. The method as claimed in 4, and further comprising comparing ion implantation energy levels of the respective ion implantation apparatuses derived from the sheet resistance values measured for each of the semiconductor substrates.

7. The method as claimed in 2, wherein said second implantation process comprises initiating the second process at set level of ion implantation energy, and varying the level of ion implantation energy within a range of 0.5~8% of the initial set level of ion implantation energy.

8. The method as claimed in 2, wherein each said at least one semiconductor substrate is doped with a p-type impurity, and one of said first and second implantation processes comprises doping each said at least one substrate with an n-type impurity, and the other of said first and second ion implantation processes comprises doping each said at least one substrate with a p-type impurity to a depth less than the depth to which the substrate was doped with the n-type impurity, whereby a p-well is formed within and at the top of an n-well in each said at least one substrate.

* * * * *